Nov. 21, 1967 J. D. HELMS 3,353,263

SUCCESSIVELY STACKING, AND WELDING CIRCUIT CONDUCTORS THROUGH INSULATION BY USING ELECTRODES ENGAGING ONE CONDUCTOR

Filed Aug. 17, 1964

INVENTOR
John Douglas Helms

BY James O. Dixon
ATTORNEY

United States Patent Office 3,353,263

Patented Nov. 21, 1967

3,353,263

SUCCESSIVELY STACKING, AND WELDING CIRCUIT CONDUCTORS THROUGH INSULATION BY USING ELECTRODES ENGAGING ONE CONDUCTOR

John Douglas Helms, Dallas, Tex., assignor to Texas Instruments Incorporated, Dallas, Tex., a corporation of Delaware Filed Aug. 17, 1964, Ser. No. 389,900
6 Claims. (Cl. 29—626)

This invention relates to electrical connections, and more particularly to the interconnection of microminiature modules.

In the past decade there have been tremendous technical advances in the electronics industry which have succeeded each other in rapid succession. These advances have allowed the industry today to develop microminiature modules, such as semi-conductor devices which perform either partial or complete circuit functions. Two rather common techniques of manufacturing these microminiature modules are the thin-film approach and the semiconductor approach. These modules are characterized by high reliability, small size, low weight, low power consumption and high power efficiency. Because of these desirable characteristics, these modules have gained wide acceptance in the electronics industry.

Another desirable characteristic of microminiature modules is that by a series of sequential photo-resist and diffusion steps, upwards of 40 individual circuits can be produced simultaneously on a single silicon wafer approximately one inch in diameter. By the use of a lead pattern to interconnect the various components, the module is thereby completed and may be cut into individual bars. With reasonable yields, material and labor cost can be kept very low, and because of the relative simplicity of fabricating these microminiature modules, they lend themselves to mass production and automated assembly.

Not only have digital circuits been fabricated by the use of these modules but also linear circuits as well. A typical example of the dimensions of one of these modules, such as a multivibrator, is ¼ of an inch long, ⅛ of an inch wide and 1/32 of an inch thick. This module will have a microminiature 0.001 cubic inch volume and a weight of 0.1 gram with usually a flat, rectangular configuration with lateral leads extending from the module with a center-to-center spacing of 0.050 inch.

Because of these advances in extremely small circuit configurations, interconnection of the module leads (with the above-mentioned 0.050 inch spacing, for example) presents a major problem. When several of these modules are to be connected together in a system, it is difficult to space them closely together and also interconnect the modules using conventional connection systems, such as etch circuit boards. On the other hand, if the microminiature modules are not closely spaced, much of the space saving advantage of using them is wasted. Besides the difficulty of implementing miniature interconnecting patterns to connect miniature modules, a further problem is in devising a technique which will lend itself to automated processing and thereby reduce material and labor costs in a proportionate degree with that of the modules themselves.

It is therefore an object of the present invention to provide electrical interconnections between conductive parts which are suitable for complex interconnection patterns in such a way as to confine the electrical connections in a volume compatible with that of the microminiature module.

Another object of the invention is to provide electrical interconnections of conductive parts which will enable the use of automated assembly and testing processes, thereby resulting in increased production rates.

A feature of the present invention is the connection of conductive parts separated by an insulator by the application of a sufficient quantity of localized heat to one of the conductive parts, thereby effecting an electrical interconnection between said conductive parts.

Another feature of the invention is the connection of three dimensional multi-layered conductive parts, each separated by an insulator, by the application of a sufficient quantity of localized heat to a conductive part in one of said layers to effect an electrical connection to a conductive part in another of said layers.

A further feature of the invention is the interconnection of alternate layers of conductors and insulators to an insulating circuit board with electrical feed-throughs therein.

For a more complete understanding of the present invention and for further objects and advantages thereof, reference may now be had to the following description taken in conjunction with the appended claims and accompanying drawings in which:

Figure 1:
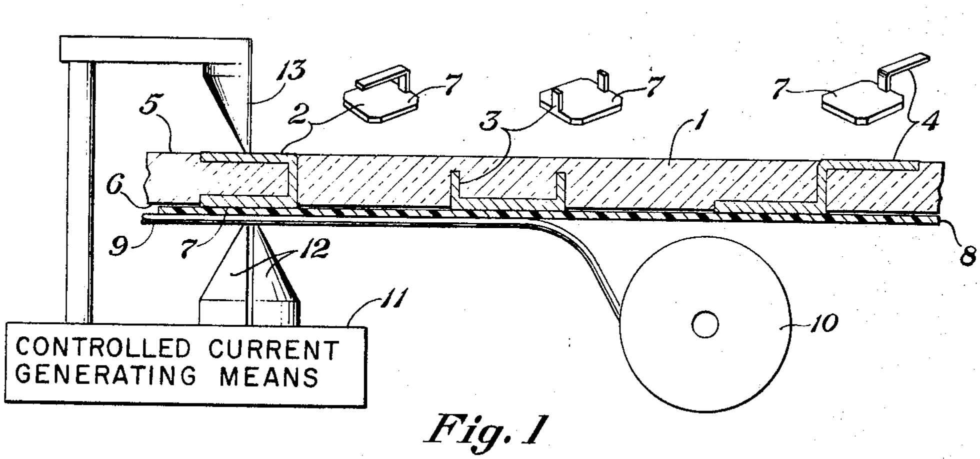
FIG. 1 is a sectional view of conductive parts which are to be interconnected by the method of the present invention.

Referring now to FIG. 1, there is illustrated a section of a circuit board base 1 with metallic feed-through pads 2, 3 and 4 connected thereto at appropriate locations and in suitable dimensions. Circuit board base 1 may be made of Fiberglas, phenolic or other insulating materials commonly used in the manufacture of said boards. Feed-through pads 2, 3 and 4 are called "C," "Idler" and "Z" clips, respectively, and connect the component side 5 of said base board to the interconnection side 6. In the preferred embodiment of the invention, the interconnection side of the feed-through clips forms an enlarged conductive surface 7 to which the various interconnections may be made. The component side of said feed-through clips 2 and 4 form suitable surfaces to receive semiconductor modules.

Placed adjacent to the feed-through pads on the interconnection side of board 1 is an insulating film 8 (such as a plastic layer or strip) usually transparent and approximately .002 to .005 inch thick, such as Mylar, by way of example. By thus electrically isolating the enlarged surfaces 7 by the use of said insulating layer, an electrical conductor 9 may be placed on said layer which is electrically insulated from said surfaces. Conductor 9 may be dispensed by a wire feed reel 10 which further may be geared to be driven by current generating means 11. An alternate approach to placing the insulating strip over the feed-throughs and then positioning the conductors thereon would be to pre-position the conductors on the insulator and adhere said conductors to the insulator by means of an adhesive. To interconnect the conductor 9, by way of example, to the enlarged surface 7 of feed-through 2, electrodes 12 of the current generating means are brought into proximity to conductor 9 and opposite to the areas of the enlarged surface 7 of feed-through 2 to which electrical connection is made. Upon the application of a controlled current through the electrodes 12, localized heat is produced in the conductor 9 which is sufficient to penetrate and melt the insulating layer 8 and form an interconnection between conductor 9 through the insulating film to the enlarged pad 7. Said current generating means, by way of example, may be of the type described in my Patent No. 3,275,790, entitled Welding Apparatus, dated Sept. 27, 1966 and assigned to the same assignee as the present application. By using such a welding apparatus or similar device, a controlled current and therefore a controlled heat dissipation will occur across the area to be interconnected, thus forming a highly reliable connection between the conductive parts 9 and 7 through insulating layer 8.

An additional test electrode 13 (FIG. 1), in contact with the feed-through to be interconnected, can perform various control functions, such as inhibiting the welding in the case of an imperfect connection. With associated circuitry, the test electrode may also be used as a means for initiating the weld burst to be applied to the area to be interconnected. Upon starting the sequence of interconnection, a current may be passed through the electrodes 12 and conductor 9 which produces a heating level in said conductor sufficient to penetrate the insulation layer. When conductor 9 comes into electrical contact with feed-through 2 (and therefore electrode 13), the welder will pass a weld burst which interconnects conductor 9 to feed-through 2. Other control functions may be performed by the use of such an electrode.

Figure 2:
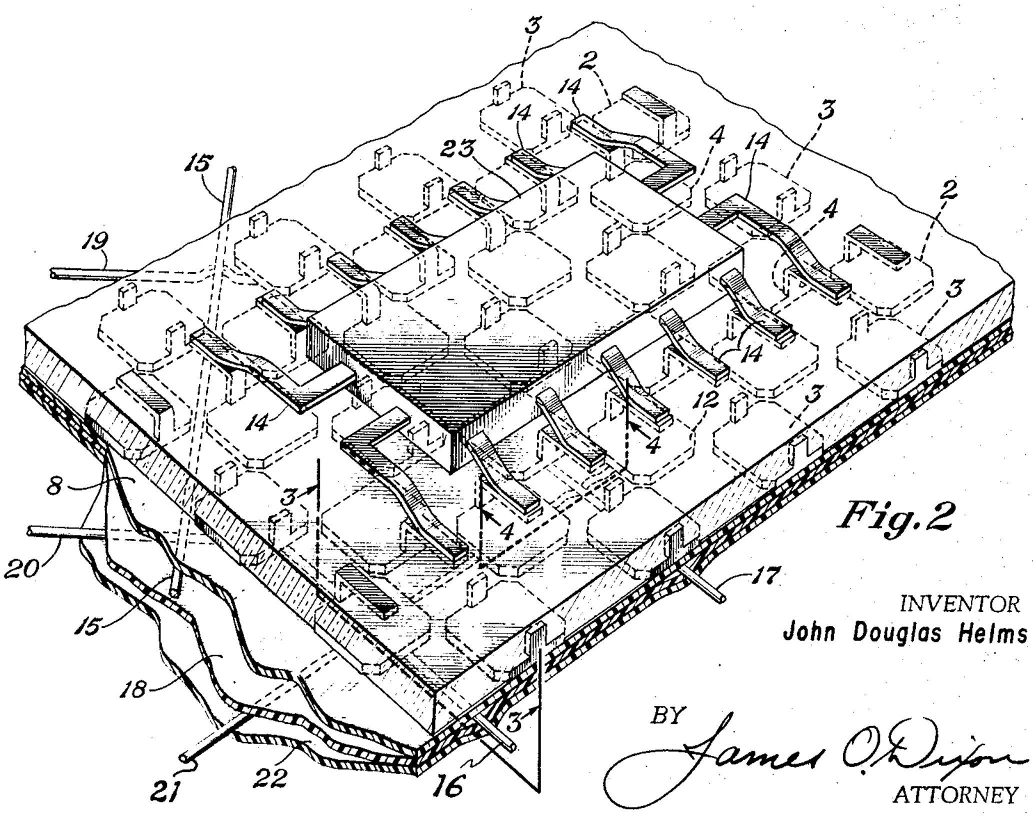
FIG. 2 is a pictorial view, with the insulating layers partly unfolded, of an embodiment of the present invention with a semiconductor module placed on the board base.

FIG. 2 shows a pictorial view of a semiconductor module partially connected to the base board 1 and to various feed-throughs by the technique of the present invention. Semiconductor module 23 is secured to circuit board base 1 by welding (or by other attachment methods) the module leads 14 to the component side of the appropriate feed-throughs 2 and 4.

Insulating layer 8 is then placed over the interconnection side of the feed-throughs 2, 3 and 4 thereby electrically isolating said feed-throughs from any wires, such as wires 15, 16 and 17 beneath the insulating layer.

Figure 3:
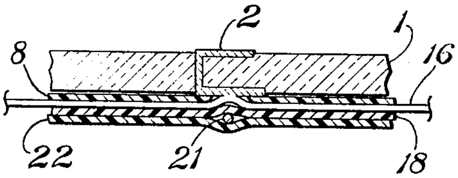
FIG. 3 is a sectional view of FIG. 2 along the section line 3—3.

FIG. 3 shows the cross section of FIG. 2, taken along the section line 3—3. As can be seen from said cross-section, conductor 16 is connected to the feed-through 2 by the method described above. The bend in conductor 16 at the point of connection to feed-through 2 is caused by the combination of the pressure applied by electrodes 12 (FIGURE 1) to the conductor 16 and the heat transfer characteristics of the conductor and the insulating layer 8, thereby causing the conductor to be melted and to form such a bend. Conductor 16 is interconnected to feed-through 2 and continues on for further desired interconnections (see FIG. 2). Conductors 15 and 17, lying in the same plane as conductor 16, are interconnected in a predetermined pattern to the appropriate feed-throughs.

After all of the interconnections of the conductors lying in the same plane as conductors 15, 16 and 17 have been completed, a second insulating layer 18 is placed adjacent to the first layer of conductors. Said second insulating layer 18 enables cross-feed wires 19, 20 and 21 to cross over the first layer of conductors without shorting said second layer of conductors to said first layer of conductors. This desirable feature of being able to cross conductors in different layers without shorting the two conductors together is shown in FIG. 3 wherein conductor 21 (going into the page) crosses over conductor 16 without being shorted or connected thereto.

Figure 4:
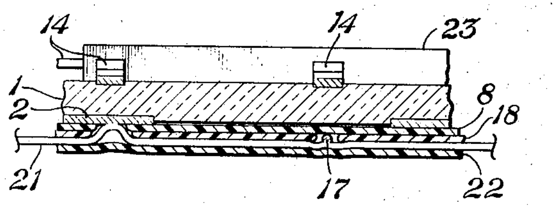
FIG. 4 is a sectional view of FIG. 2 along the section line 4—4.

FIG. 4 demonstrates the further flexibility of the electrical interconnections which can be made by the present invention. Said FIG. 4 represents the cross-section of FIG. 2 taken along the section line 4—4 and shows the interconnection of conductor 21 through the two insulating layers 8 and 18 to feed-through 2 overlying said conductor 21.

Another type of interconnection which can be made is between conductors in different planes through one or more insulating means. Conductor 21 in the second plane of conductors is interconnected to conductor 17 in the first plane of conductors (see FIG. 4). Thus the cross-feed wires may be interconnected to the feed-throughs passing through two layers of insulation or selectively interconnected to the conductors lying in the plane of conductors 15, 16 and 17. After the interconnection of the conductors in the second plane has been completed, a third insulating means 22 may be placed over the second plane of conductors in order to insulate and protect the wires in the second plane, or to facilitate the accommodation of a third layer of conductors if such is necessary to complete the interconnection of the system. This method of alternating layers of insulating means with conductors may be continued until the interconnection of the components on the circuit board base 1 is complete and thereby form a three-dimensional spaced relationship of interconnections.

The present description makes it plain to one skilled in the art how the invention may be adapted to automated assembly of the electrical interconnections. By using a welding apparatus (such as the one above-mentioned as a typical example) as the controlled current generating means which effects the electrical interconnections, the weld head (electrodes) associated with the welding apparatus can be moved automatically with respect to the circuit board base, or the base can be moved automatically with respect to the electrodes. To perform these operations, a device such as described in copending application entitled, Positioning Apparatus, Ser. No. 302,194, filed Aug. 14, 1963, and assigned to the same assignee as the present application, could be used. This device could move the board base in any direction in the *x–y* plane in predetermined increments controlled by a punched tape or logic circuitry to make the desired connections. Thus by the use of the present interconnection technique with such a positioning apparatus, a wire start mechanism, a shear knife and tape or logic controls, electronic systems could be assembled completely automatically by the use of the interconnecting teachings of this invention.

Having described the invention in connection with certain embodiments thereof, it will be understood that further modifications will suggest themselves to those skilled in the art and it is intended to cover such modifications as fall within the scope of the appended claims.

What is claimed is:

1. A method of electrically connecting a circuit board base having component and interconnection sides with electrical feed-throughs therebetween, comprising the steps of (a) overlying the interconnection side of said feed-throughs with a first non-perforated insulating means, (b) selectively placing first interconnecting means adjacent to said first insulating means, (c) selectively conductively connecting said first interconnecting means to said feed-throughs through said first insulating means by contacting said first interconnecting means with the electrodes of a current device, applying pressure to said first interconnecting means with said electrodes, and passing current through said electrodes and said first interconnecting means for the application of a sufficient amount of heat to said first interconnecting means to melt said first insulating means and weld said first interconnecting means to said feed-throughs, (d) overlying said first interconnecting means with a second non-perforated insulating means, (e) selectively placing a second interconnecting means over said second insulating means, and (f) selectively conductively connecting said second interconnecting means through said first and second insulating means to said feed-throughs by contacting said second interconnecting means with the electrodes of a current device, applying pressure to said second interconnecting means with said electrodes, and passing current through said electrodes and said second interconnecting means for the application of a sufficient amount of heat to said second interconnecting means to melt said first and second insulating means and weld said second interconnecting means to said feed-throughs.

2. A method of electrically connecting a circuit board base having component and interconnection sides with electrical feed-throughs therebetween, comprising the steps of (a) overlying the interconnection side of said feed-throughs with a first non-perforated insulating means,
(b) selectively placing first interconnecting means adjacent to said first insulating means,
(c) selectively conductively connecting said first interconnecting means to said feed-throughs through said first insulating means by contacting said first interconnecting means with the electrodes of a current device, applying pressure to said first interconnecting means with said electrodes, and passing current through said electrodes and said first interconnecting means for the application of a sufficient amount of heat to said first interconnecting means to melt said first insulating means and weld said first interconnecting means to said feed-throughs,
(d) overlying said first interconnecting means with a second non-perforated insulating means,
(e) selectively placing a second interconnecting means over said second insulating means, and
(f) selectively conductively connecting said second interconnecting means to said first interconnecting means through said second insulating means by contacting said second interconnecting means with the electrodes of a current device, applying pressure to said interconnecting means with said electrodes, and passing current through said electrodes and said second interconnecting means for the application of a sufficient amount of heat to said second interconnecting means to melt said second insulating means and weld said second interconnecting means to said first interconnecting means.

3. A method as defined in claim 2 including the step of connecting microminiature modules to the component side of said feed-throughs.

4. A method of electrically connecting a circuit board base having component and interconnection sides with electrical feedthroughs therebetween, comprising the steps of:
(a) overlying the interconnection side of said feed-throughs with a first nonperforated insulating means having first interconnecting means selectively prepositioned thereon,
(b) selectively conductively connecting said first interconnecting means to said feedthroughs by contacting said first interconnecting means with the electrodes of a current device, applying pressure to said first interconnecting means with said electrodes, and passing current through said electrodes and said first interconnection means for the application of a sufficient amount of heat to said first interconnecting means to melt said first insulating means and weld said first interconnecting means to said feedthroughs,
(c) overlying said first insulating means having first interconnecting means selectively prepositioned thereon with a second nonperforated insulating mean having second interconnecting means selectively prepositioned thereon, and
(d) selectively conductively connecting said second interconnecting means to said feedthroughs through said first and second insulating means by contacting said second interconnecting means with electrodes of a current device, applying pressure to said second interconnecting means with said electrodes, and passing current through said electrodes and said second interconnecting means for the application of a sufficient amount of heat to said second interconnecting means to melt said first and said second insulating means and weld said second interconnecting means to said feedthroughs.

5. A method as defined in claim 4 including the step of connecting microminiature modules to the component side of said feed-throughs.

6. A method of electrically connecting a circuit board base having component and interconnection sides and electrical feedthroughs therebetween, comprising the steps of:
(a) overlying the interconnecting side of said feed-throughs with a first non-perforated insulating means having first interconnecting means selectively prepositioned thereon,
(b) selectively conductively connecting said first interconnecting means to said feedthroughs by contacting said first interconnecting means with the electrodes of a current device, applying pressure to said first interconnecting means with said electrodes, and passing current through said electrodes and said first interconnecting means for the application of a sufficient amount of heat to said first interconnecting means to melt said first insulating means and weld said first interconnecting means to said feedthroughs,
(c) overlying said first insulating means having first interconnecting means selectively prepositioned thereon with a second non-perforated insulating means having second interconnecting means selectively prepositioned thereon, and
(d) selectively conductively connecting said second interconnecting means to said first interconnecting means through said second insulating means by contacting said second interconnecting means with electrodes of a current device, applying pressure to said second interconnecting means with said electrodes, and passing current through said electrodes and said second interconnecting means for the application of a sufficient amount of heat to said second interconnecting means to melt said second insulating means and weld said second interconnecting means to said first interconnecting means.

References Cited

UNITED STATES PATENTS

| | | | |
|---|---|---|---|
| 2,399,753 | 5/1946 | McLarn | 29—155.5 X |
| 2,648,792 | 8/1953 | Wylie | 310—234 |
| 3,040,415 | 6/1962 | Rayburn | 29—25.42 |
| 3,083,261 | 3/1963 | Francis et al. | 174—88 |
| 3,151,277 | 9/1964 | Gray | 317—101 |
| 3,155,809 | 11/1964 | Griswold | 29—155.55 X |
| 3,177,405 | 4/1965 | Gray | 317—101 |
| 3,185,761 | 5/1965 | McHugh | 174—68.5 |
| 3,187,210 | 6/1965 | Ost | 317—100 |
| 3,197,608 | 7/1965 | Ingram | 219—85 |
| 3,244,798 | 4/1966 | Warner | 174—84 |

CHARLIE T. MOON, *Primary Examiner.*

R. W. CHURCH, *Assistant Examiner.*